(12) United States Patent
Carey et al.

(10) Patent No.: US 7,170,722 B2
(45) Date of Patent: Jan. 30, 2007

(54) EXTRAORDINARY MAGNETORESISTANCE SENSOR WITH PERPENDICULAR MAGNETIC BIASING BY A FERROMAGNETIC MULTILAYER

(75) Inventors: Matthew J. Carey, San Jose, CA (US); Bruce A. Gurney, San Rafael, CA (US); Stefan Maat, San Jose, CA (US); Neil Smith, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 411 days.

(21) Appl. No.: 10/903,173

(22) Filed: Jul. 30, 2004

(65) Prior Publication Data

US 2006/0023369 A1    Feb. 2, 2006

(51) Int. Cl.
*G11B 5/33* (2006.01)
(52) U.S. Cl. .................................... 360/324
(58) Field of Classification Search ............ 360/324, 360/326, 319, 313; 324/252; 428/692; 338/32 R
See application file for complete search history.

(56) References Cited

U.S. PATENT DOCUMENTS

| 5,965,283 | A | 10/1999 | Solin et al. |
| 6,353,317 | B1 | 3/2002 | Green et al. |
| 6,650,513 | B2 | 11/2003 | Fullerton et al. |
| 6,707,122 | B1 | 3/2004 | Hines et al. |
| 6,714,374 | B1 | 3/2004 | Hayashi et al. |
| 2003/0128478 | A1 | 7/2003 | Gill et al. |
| 2004/0218309 | A1* | 11/2004 | Seigler ..................... 360/313 |

FOREIGN PATENT DOCUMENTS

JP    2001223411    *  8/2001

OTHER PUBLICATIONS

T. Zhou, et al. "Extraordinary magnetoresistance in externally shunted van der Pauw plates", Appl. Phys. Lett., vol. 78, No. 5, Jan. 29, 2001, pp. 667-669.
S. A. Solin et al., "Nonmagnetic semiconductors as read-head sensors for ultra-high-density magnetic recording", Appl. Phys. Lett., vol. 80, No. 21, May 27, 2002, pp. 4012-4014.

* cited by examiner

*Primary Examiner*—Angel Castro
(74) *Attorney, Agent, or Firm*—Thomas R. Berthold

(57) ABSTRACT

An extraordinary magnetoresistance (EMR) sensor uses a ferromagnetic multilayer to provide perpendicular magnetic biasing for the sensor. The ferromagnetic multilayer has intrinsic perpendicular magnetic anisotropy and is preferably on top of the EMR active film. The multilayer comprises alternating films of Co, Fe or CoFe and Pt, Pd or PtPd with the preferred multilayer being alternating Co/Pt or Co/Pd films. A diffusion barrier may be located between the EMR active film and the ferromagnetic multilayer.

15 Claims, 5 Drawing Sheets

EXTRAORDINARY MAGNETORESISTANCE SENSOR WITH PERPENDICULAR MAGNETIC BIASING BY A FERROMAGNETIC MULTILAYER

BACKGROUND OF THE INVENTION

1. Field of the Invention

This invention relates generally to a magnetoresistive sensor, and more particularly to such a sensor based on extraordinary magnetoresistance (EMR).

2. Description of the Related Art

A magnetoresistive sensor based on extraordinary magnetoresistance (EMR) has been proposed as a read-head sensor for magnetic recording hard disk drives. Because the active region in the EMR sensor is formed of nonmagnetic semiconductor materials, the EMR sensor does not suffer from the problem of magnetic noise that exists in read-head sensors based on giant magnetoresistance (GMR) and tunneling magnetoresistance (TMR), both of which use magnetic films in their active regions.

The EMR sensor includes a pair of voltage leads and a pair of current leads in contact with one side of the active region and an electrically conductive shunt in contact with the other side of the active region. In the absence of an applied magnetic field, sense current through the current leads passes into the semiconductor active region and is shunted through the shunt. When an applied magnetic field is present, current is deflected from the shunt and passes a longer distance through the semiconductor active region, thereby increasing the resistance of the device because of the higher resistivity of the semiconductor active region. The change in electrical resistance due to the applied magnetic field is detected across the voltage leads. EMR is described by T. Zhou et al., "Extraordinary magnetoresistance in externally shunted van der Pauw plates", *Appl. Phys. Lett.*, Vol. 78, No. 5, 29 Jan. 2001, pp. 667–669. An EMR sensor for read-head applications is described by S. A. Solin et al., "Nonmagnetic semiconductors as read-head sensors for ultra-high-density magnetic recording", *Appl. Phys. Lett.*, Vol. 80, No. 21, 27 May 2002, pp. 4012–4014.

One of the problems of the EMR sensor is that its magnetoresistance is an approximately quadratic function of the applied magnetic field. Thus the magnetoresistance response is small and nonlinear in the presence of the small magnetic fields from the recorded magnetic media. Biasing of the EMR sensor has been proposed by an asymmetric location of the voltage leads.

Biasing of the EMR sensor has also been proposed by use of a biasing magnet located on a substrate with a spacer layer on top of the magnet and the EMR sensor formed on top of the spacer layer. This structure is described in U.S. Pat. No. 6,714,374 and proposes a layer of a CoCr-based alloy with perpendicular magnetization for the biasing magnet. This structure is relatively difficult to fabricate because the sensor's semiconductor layers must be formed on top of the CoCr metal layer. In addition, the use of a fixed composition for the CoCr-based alloy makes it difficult to adjust the magnetization and coercivity of the biasing magnet, which may be required during fabrication of the sensor.

Co-pending application Ser. No. 10/883,204 filed Jun. 30, 2004, titled "EXTRAORDINARY MAGNETORESISTANCE SENSOR WITH PERPENDICULAR MAGNETIC BIASING BY AN ANTIFERROMAGNETIC/FERROMAGNETIC EXCHANGE-COUPLED STRUCTURE", and owned by the same assignee as this application, describes biasing of an EMR sensor using a ferromagnetic layer with perpendicular exchange-coupling to an antiferromagnetic layer.

What is needed is an EMR sensor with an improved perpendicular magnetic biasing layer that is easier to fabricate and that does not use an antiferromagnetic layer.

SUMMARY OF THE INVENTION

The invention is an EMR sensor that uses a ferromagnetic multilayer to provide perpendicular magnetic biasing for the sensor. The ferromagnetic multilayer has intrinsic perpendicular magnetic anisotropy and is preferably on top of the EMR active film. The multilayer comprises alternating films of Co, Fe or CoFe and Pt, Pd or PtPd with the preferred multilayer being alternating Co/Pt or Co/Pd films. A diffusion barrier may be located between the EMR active film and the ferromagnetic multilayer.

For a fuller understanding of the nature and advantages of the present invention, reference should be made to the following detailed description taken together with the accompanying figures.

DETAILED DESCRIPTION OF THE INVENTION

Prior Art

Figure 1:
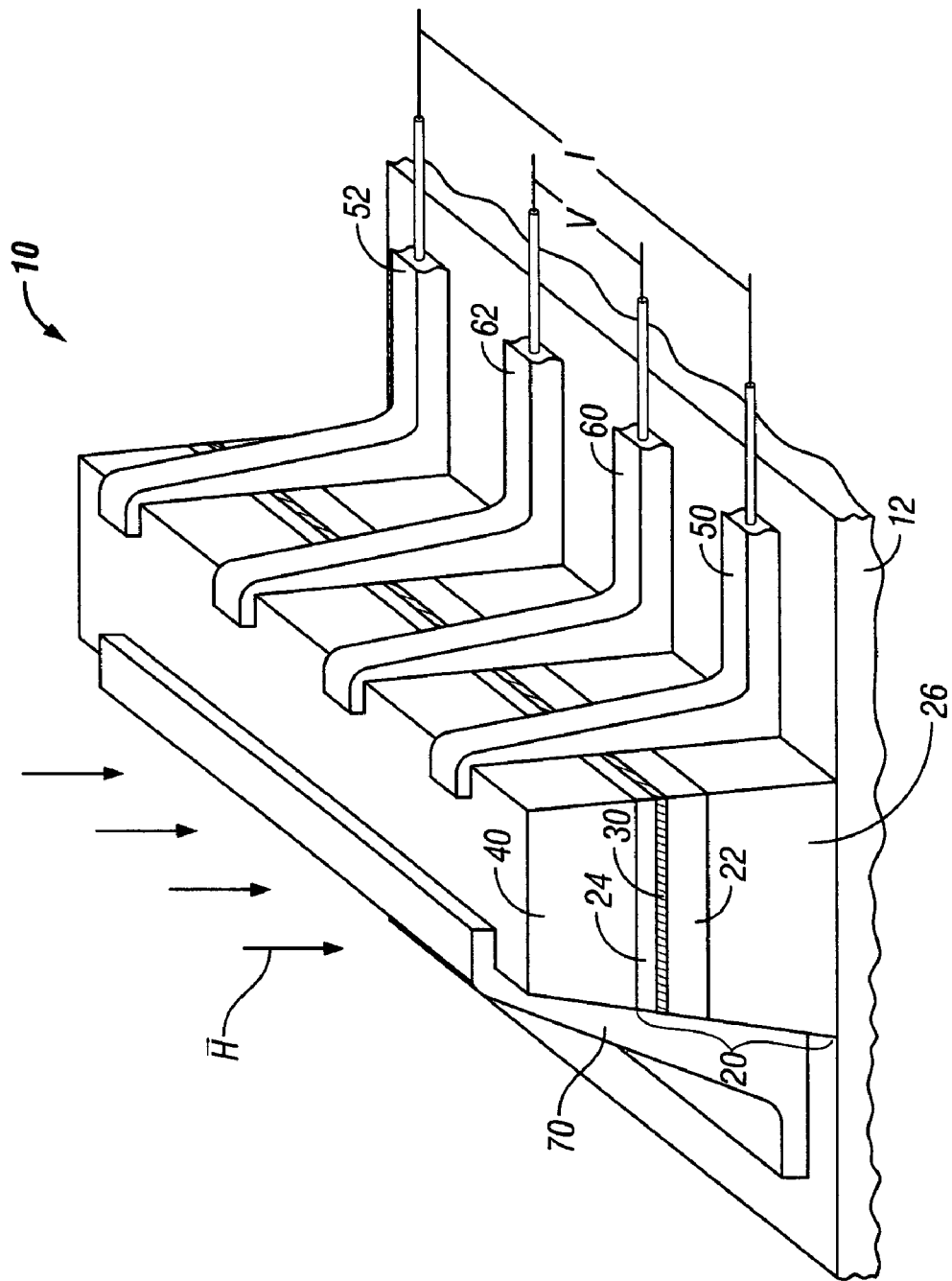
FIG. 1 is an isometric view of the prior art EMR sensor.

FIG. 1 is an isometric view of the prior art EMR sensor 10. The EMR sensor 10 includes a structure 20 that is a III–V heterostructure formed on a semiconducting substrate 12 such as GaAs. However, the EMR sensor described in this invention is not restricted to III–V semiconductor materials. For example, it may also be formed on the basis of silicon. The heterostructure 20 includes a first layer 22 of semiconducting material having a first band-gap, a second layer 30 of semiconducting material formed on top of the first layer 22 and having a second band gap smaller than the first band gap, and a third layer 24 of semiconducting material formed on top of the second layer 30 and having a third band gap greater than the second band gap. The materials in first and third layers 22, 24 may be similar or identical. An energetic potential well (quantum well) is created by the first, second and third semiconducting material layers due to the different band-gaps of the different materials. Thus carriers can be confined inside layer 30, which is considered the EMR active film in the sensor 10.

The first layer 22 is typically formed on top of a buffer layer 26 that may be one or more layers. The buffer layer 26 comprises several periods of a superlattice structure that function to prevent impurities present in the substrate from migrating into the functional layers 22, 24 and 30. In addition, the buffer layer 26 is chosen to accommodate the typically different lattice constants of the substrate 12 and the functional layers of the heterostructure 20 to thus act as a strain relief layer between the substrate and the functional layers.

One or more doped layers are incorporated into the semiconducting material in the first layer 22, the third layer 24, or both layers 22 and 24, and spaced apart from the boundary of the second and third semiconducting materials. The doped layers provide electrons (if n-doped) or holes if (p-doped) to the quantum well. The electrons or holes are concentrated in the quantum well in the form of a two-dimensional electron-gas or hole-gas, respectively.

As described in the previously-cited references, the layers 22/30/24 may be a $Al_{0.09}In_{0.91}Sb/InSb/Al_{0.09}In_{0.91}Sb$ heterostructure grown onto a semi-insulating GaAs substrate 12 with a buffer layer 26 in between. InSb is a narrow band-gap semiconductor. Narrow band-gap semiconductors typically exhibit have high electron mobility, since the effective electron mass is greatly reduced. Typical narrow band-gap materials are InSb and InAs. For example, the room temperature electron mobility of InSb and InAs can be as high as 70,000 $cm^2$ Vs and 35,000 $cm^2$ Vs, respectively.

The bottom $Al_{0.09}In_{0.91}Sb$ layer 22 formed on the buffer layer 26 has a thickness in the range of approximately 1–3 microns and the top $Al_{0.09}In_{0.091}Sb$ layer 24 has a thickness in the range of approximately 10 to 1000 nm, typically 50 nm. The doping layers incorporated into layer 22 or 24 have a thickness from one monolayer (delta-doped layer) up to 10 nm. The doping layer is spaced from the $InSb/Al_{0.09}In_{0.9}Sb$ boundaries of first and second or second and third semiconducting materials by a distance of 10–300 Å. N-doping is preferred, since electrons typically have higher mobility than holes. The typical N-dopant is silicon with a concentration in the range of 1 to $10^{19}/cm^3$. The deposition process for the heterostructure 20 is preferably molecular-beam-epitaxy, but other epitaxial growth methods can be used.

A capping layer 40 is formed over the heterostructure 20 to protect the device from corrosion. The capping layer is formed of an insulating material such as oxides or nitrides of aluminum or silicon (e.g., $Si_3N_4$, $Al_2O_3$) or a non-corrosive semi-insulating semiconductor.

Two current leads 50, 52 and two voltage leads 60, 62 are patterned over one side of the EMR structure 20 so that they make electrical contact with the quantum well. A metallic shunt 70 is patterned on the side opposite the current and voltage leads of the EMR structure 20 so that it makes electrical contact with the quantum well. The applied magnetic field H, i.e., the magnetic field to be sensed, is shown by the arrows and is normal to the plane of the films in the EMR structure 20. The leads typically comprise metallic contacts, for example Au, AuGe, or Ge diffused into the device. The leads are typically formed after formation of the capping layer 40, and sometimes after removal of some of the capping layer material.

Figure 2:
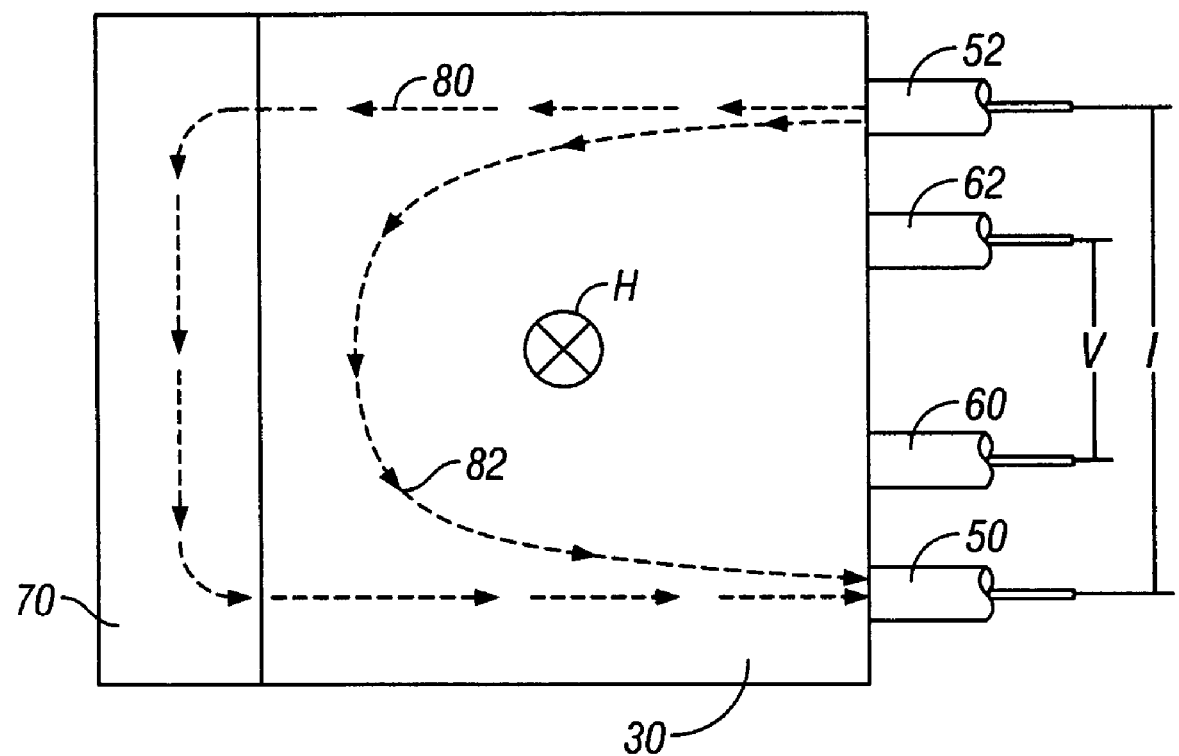
FIG. 2 is a top schematic view of the prior art EMR sensor of FIG. 1 through a section of the EMR active film illustrating the basic operation of the sensor.

FIG. 2 is a top schematic view of the EMR sensor 10 through a section of active film 30 and will illustrate the basic operation of the sensor. In the absence of an applied magnetic field H, sense current through leads 50, 52 passes into the semiconductor active film 30 and is shunted through shunt 70, as shown by line 80. When an applied magnetic field H is present, as shown by the arrow tail into the paper in FIG. 2, current is deflected from shunt 70 and passes primarily through the semiconductor active film 30, as shown by line 82. The change in electrical resistance due to the applied magnetic field is detected across the voltage leads 60, 62.

Figure 3A:
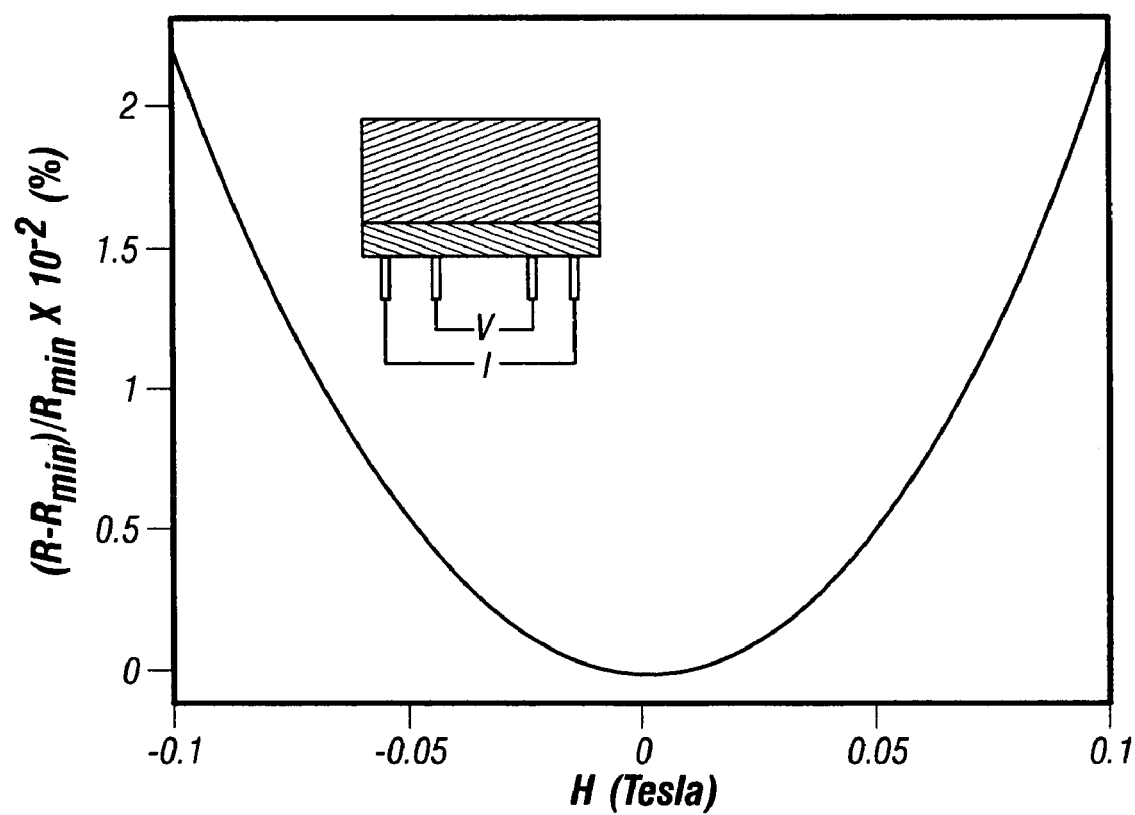
FIG. 3A is the theoretical magnetoresistance vs. field response for a prior art EMR sensor with symmetric current and voltage leads

One of the problems of the prior art EMR sensor 10 is that its magnetoresistance [$(R-R_{min})/R_{min}$] is approximately quadratic as a function of the applied magnetic field. Therefore, in applied magnetic fields in the range of interest, i.e., the small magnetic fields from recorded magnetic media, the magnetoresistance response is small and nonlinear. This is shown by the theoretical magnetoresistance vs. field response in FIG. 3A for an EMR sensor with symmetric current and voltage leads like that shown in FIGS. 1–2 and in the diagram in FIG. 3A.

Figure 3B:
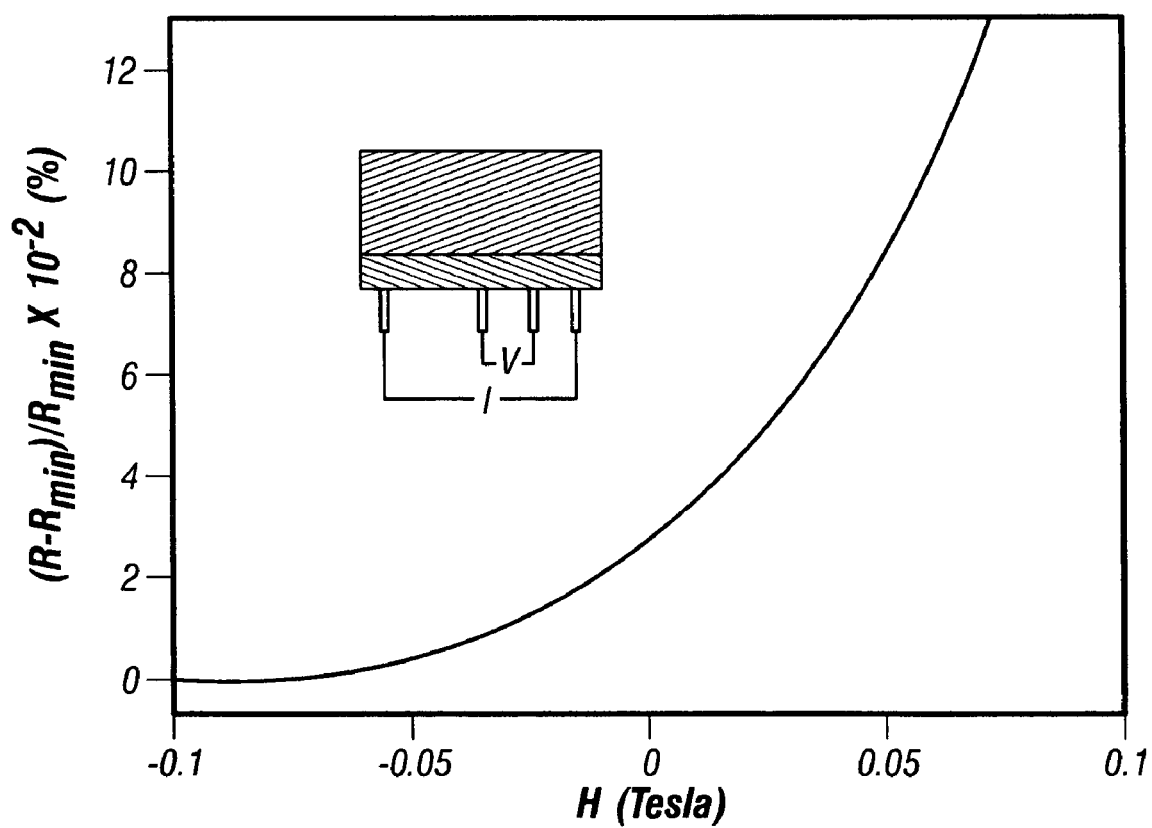
FIG. 3B is the theoretical magnetoresistance vs. field response for a prior art EMR sensor with asymmetric voltage leads.

Biasing of the EMR sensor has been proposed by an asymmetric location of the voltage leads, as shown by the diagram in FIG. 3B. FIG. 3B shows the theoretical magnetoresistance vs. field response for an EMR sensor with asymmetric voltage leads. The sensor of FIG. 3B has a higher magnetoresistance and a more linear response at zero applied magnetic field than the sensor of FIG. 3A.

Biasing of the EMR sensor has also been proposed by use of a biasing magnet located on a substrate with a spacer layer on top of the magnet and the heterostructure 20 of the EMR sensor formed on top of the spacer layer. This structure is described in U.S. Pat. No. 6,714,374 and proposes a layer of a CoCr-based alloy with perpendicular magnetization for the biasing magnet.

The Invention

The EMR sensor of this invention includes a ferromagnetic multilayer of alternating first and second films on top of the EMR film structure. The first film is Co, Fe or an alloy consisting essentially of Co and Fe, and the second film is Pt, Pd or an alloy consisting essentially of Pt and Pd. Each set of a first and second film is a bilayer, with the multilayer comprising a plurality of these bilayers. This multilayer has perpendicular magnetic anisotropy due to large out-of-plane surface anisotropy at the Co (or Fe or CoFe) and Pt (or Pd or PtPd) interfaces and provides an out-of-plane magnetic field that biases the magnetoresistance vs. field response of the EMR sensor.

Figure 4:
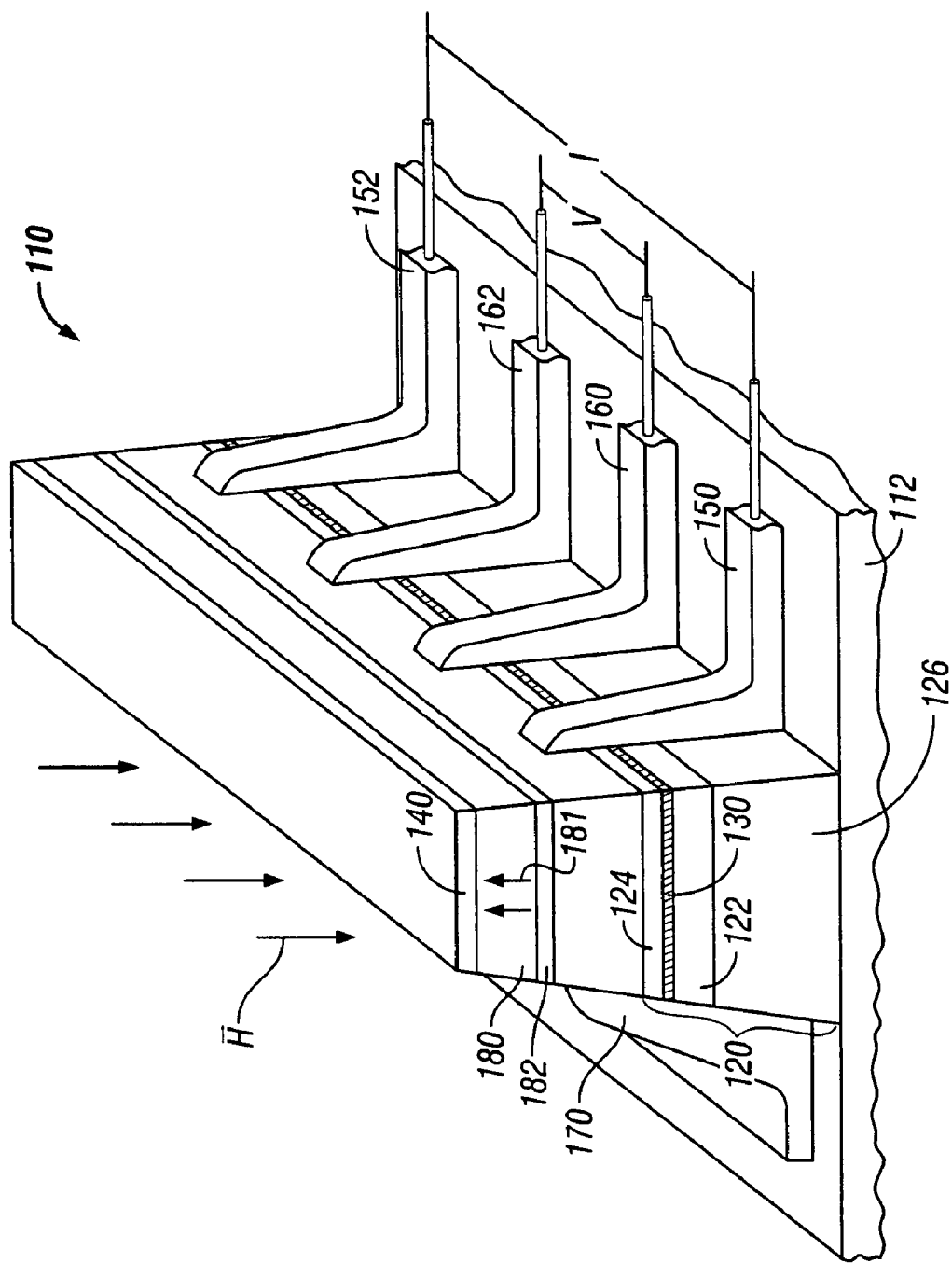
FIG. 4 is an isometric view of the EMR sensor according to this invention.

FIG. 4 is an isometric view of the EMR sensor according to this invention. The EMR sensor 110 is like the prior art sensor 10 in that has a quantum well film structure 120, including the first semiconducting layer 122, the second semiconducting and EMR active layer 130, and the third semiconducting layer 124, as well as buffer layer 126, formed on a semiconductor substrate 112. Two current leads 150, 152 and two voltage leads 160, 162 make electrical contact with EMR active film 130 and metallic shunt 170 makes electrical contact with EMR active film 130 on the side opposite the current and voltage leads. The applied magnetic field H, i.e., the magnetic field to be sensed, is shown by the arrows and is normal to the plane of the films in the EMR structure 120. A capping layer 140 is on top of sensor 110.The EMR sensor 110 includes a multilayer 180 also on substrate 112. In the preferred embodiment of FIG. 4 the EMR structure 120 is depicted between the substrate 112 and the multilayer 180. Multilayer 180 has perpendicular magnetic anisotropy and an out-of-plane magnetic moment 181 oriented perpendicular to the plane of EMR active film 130. The moment 181 from multilayer 180 is a biasing magnetic field to which the EMR active film 130 is exposed. This shifts the magnetoresistance vs. field response curve so that at zero applied magnetic field the sensor 110 has a higher magnetoresisitance and a more linear response.

The material for multilayer 180 is one of the group of (Co or Fe or CoFe)/(Pt or Pd or PtPd) multilayers that exhibit intrinsic perpendicular-to-the-plane magnetic anisotropy. These multilayers comprise alternating first and second films of Co or Fe or CoFe and Pt or Pd or PtPd, respectively, with the preferred multilayer being alternating Co/Pt or Co/Pd films. If the first film is an alloy consisting essentially of Co and Fe, it can have any amount of Co and Fe. Similarly, if the second film is an alloy consisting essentially of Pt and Pd, it can have any amount of Pt and Pd. They can be prepared within a wide range of coercivities and effective magnetizations, even when deposited at room or low temperatures, by relatively easy selection of the number of films in the multilayer and the ratio of the first to second film thickness. The high tunability of these multilayers is due to the large moment of the Co and Fe and the much smaller induced moment of the Pt or Pd, as well as the high ferromagnetic coupling of the Fe or Co layers across the Pt or Pd. In addition, these multilayers have M-H loops that have high squareness, i.e., the ratio of remanent to saturated moment is close to 1, which is desirable to provide a high remanent magnetic moment. These multilayers may also be doped with additional elements. For example, while the Co film in each Co/Pt or Co/Pd bilayer consists essentially of Co it may also include an element Y, so that the Co film is formed of a Co—Y alloy, where Y=B, Ta, Cr, O, Cu, Ag, Pt or Pd. These doping elements may be added to further tune the magnetic and chemical microstructure of the film.

The magnetic field H generated from a ferromagnetic layer magnetized perpendicular to its plane can be approximated by the field of a uniformly magnetized square block of thickness t and length L. If the origin is at the top surface of the square block, the field H along a Y-axis perpendicular to the layer is given by $$H = 4M_S \arctan\left(\frac{q_2 - q_1}{1 + q_1 q_2}\right), \text{ where}$$

$$q_2 = \frac{4(y+t)}{L}\sqrt{\frac{1}{2} + \left(\frac{y+t}{L}\right)^2} \text{ and}$$

$$q_1 = \frac{4y}{L}\sqrt{\frac{1}{2} + \left(\frac{y}{L}\right)^2}$$

and y is the distance along the Y-axis. As an example, for a multilayer with L=100 nm and comprising N bilayers of [Co(1 nm)/Pt (1 nm)] magnetized perpendicular to its plane, a square hysteresis loop, and the Co layers having a magnetization $M_S$ of about 1400 emu/cm$^3$, the magnetic field H at y=10 nm is approximately 700 Oe for N=5 and 1400 Oe for N=10. Clearly the field from the multilayer can be increased by increasing the number of bilayers it is comprised of.

The multilayer 180 has an intrinsic coercivity $H_c$. Thus, when the EMR sensor 110 is intended for use in a magnetic recording read head, the value $H_c$ must be greater than the field from the magnetic transition on the magnetic media, i.e., the sensing field which is typically in the range of +/−200 to +/−500 Oe. A value of $H_c$ greater than the field from the magnetic transition assures that the moment 181 of multilayer 180 will not be switched when exposed to the applied magnetic field. The field from the multilayer at the surface of the magnetic media must be lower than the switching field of the magnetic media to assure the bits are not switched. The use of multilayer 180 with its high tunability allows for relatively easy selection of the desired $H_c$ and relatively easy variation of $H_c$ without disruption of the fabrication process. For example, the use of 10 Co(1.1 nm)/Pt(1 nm) bilayers results in a multilayer with an $H_c$ of approximately 500 Oe. If it is desired to increase $H_c$ to approximately 5000 Oe, then this can be accomplished by decreasing the thickness of each Co film to approximately 0.2 nm. Decreasing the Co thickness further ultimately will result in decreasing the coercivity and a total loss of magnetization. Alternatively, since the coercivity strongly depends on the film microstructure it can also be changed by changing the processing parameters. For example, increasing the sputtering pressure during sputtering or using a heavy inert sputtering gas (Kr or Xe instead of Ar) will generally result in higher coercivity. Annealing at low temperatures can also be used to enhance coercivity. However annealing at too high a temperature will eventually destroy the Co/Pt interfaces and thus the large out-of-plane magnetic anisotropy. The preferred thickness range for the Co films is approximately 0.1 to 2.0 nm because a Co film thickness beyond approximately 2.0 nm will substantially reduce the out-of-plane magnetic anisotropy.

The EMR sensor 110 may also optionally include a diffusion barrier 182 between the EMR structure 120 and the multilayer 180. Suitable materials for the diffusion barrier 182 include oxides and nitrides of aluminum and silicon, e.g., $Al_2O_3$, $SiO_2$ and $Si_3N_4$.

The EMR sensor 110 is fabricated in the following manner. A heterostructure as previously described is grown onto a semi-insulating substrate. A mesa defining the shape of the EMR sensor to be fabricated is etched by reactive-ion-etching (RIE) or ion-milling. The leads 150, 152, 160, 162 and shunt 170 are then deposited, for example by use of shadow masks. Next, an insulating material such as alumina is deposited as diffusion barrier 182 above the mesa, leads and shunt. The structure is then planarized, for example by chemical-mechanical polishing (CMP). A relatively thin Pt film (or Pd film) is deposited on the diffusion barrier 182 before deposition of the first Co, Fe or CoFe film. The alternating first and second films making up multilayer 180 are then deposited by sputtering, ion-beam deposition, evaporation, molecular chemical vapor deposition (MOCVD) or a combination of these techniques. The multilayer 180 is then partially removed by RIE or ion-milling so that only the part of these layers directly above the EMR mesa structure, and in particular above the EMR active region, remains.

The relatively easy growth of the multilayer on the initial Pt (or Pd) film significantly improves the fabrication process of the EMR sensor over the prior art. A CoCr-alloy layer as the biasing magnet beneath the EMR sensor, as described in the previously cited '374 patent, requires a relatively complex set of underlayers to ensure that the Co—Cr alloy layer has out-of-plane magnetic anisotropy.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. An extraordinary magnetoresistance (EMR) sensor comprising:
   a substrate;
   an EMR active film on the substrate, the active film comprising a nonmagnetic semiconductor material responsive to a magnetic field generally perpendicular to the active film;

an electrically conductive shunt in contact with the active film;

a pair of current leads in contact with the active film;

a pair of voltage leads in contact with the active film; and a ferromagnetic multilayer on the substrate and having its magnetic moment oriented generally perpendicular to the planes of the ferromagnetic multilayer and active film, said multilayer comprising a plurality of like bilayers, said bilayer comprising a first film of Co, Fe or an alloy consisting essentially of Co and Fe and a second film of Pt, Pd or an alloy consisting essentially of Pt and Pd.

2. The sensor of claim 1 wherein the multilayer comprises a plurality of like bilayers selected from the group consisting of a cobalt-platinum (Co/Pt) bilayer and a cobalt-palladium (Co/Pd) bilayer.

3. The sensor of claim 2 wherein the thickness of the cobalt layer in each bilayer is in the range of approximately 0.1 to 2.0 nm.

4. The sensor of claim 2 wherein the cobalt layer in each bilayer comprises a Co—Y alloy, wherein Y is selected from the group consisting of B, Ta, Cr, O, Cu, Ag, Pt and Pd.

5. The sensor of claim 2 wherein the plurality of bilayers are located above the EMR active film, and further comprising an initial film of Pt between the EMR active film and the first bilayer.

6. The sensor of claim 1 wherein the ferromagnetic multilayer is located above the EMR active film.

7. The sensor of claim 6 further comprising a diffusion barrier between the EMR active film and the ferromagnetic multilayer.

8. The sensor of claim 7 wherein the diffusion barrier is selected from the group consisting of aluminum oxides, aluminum nitrides, silicon oxides, and silicon nitrides.

9. The sensor of claim 1 wherein the ferromagnetic multilayer is located between the substrate and the EMR active film.

10. An extraordinary magnetoresistance (EMR) sensor comprising:

a substrate;

an EMR active film on the substrate, the active film comprising a nonmagnetic semiconductor material responsive to a magnetic field generally perpendicular to the active film;

an electrically conductive shunt in contact with the active film;

a pair of current leads in contact with the active film;

a pair of voltage leads in contact with the active film; and a ferromagnetic multilayer on the active film and having its magnetic moment oriented generally perpendicular to the planes of the ferromagnetic multilayer and active film, said multilayer comprising a plurality of alternating first and second films, said first film consisting essentially of Co and said second film consisting essentially of an element selected from the group consisting of Pt and Pd.

11. The sensor of claim 10 wherein the thickness of said essentially cobalt film is in the range of approximately 0.1 to 2.0 nm.

12. The sensor of claim 10 wherein said first film comprises an alloy of Co and Y, wherein Y is selected from the group consisting of B, Ta, Cr, O, Cu, Ag, Pt and Pd.

13. The sensor of claim 10 further comprising an initial film of Pt between the EMR active film and the first Co film.

14. The sensor of claim 10 further comprising a diffusion barrier between the EMR active film and the ferromagnetic multilayer.

15. The sensor of claim 14 wherein the diffusion barrier is selected from the group consisting of aluminum oxides, aluminum nitrides, silicon oxides, and silicon nitrides.

* * * * *